(12) United States Patent
Bertani

(10) Patent No.: US 9,521,768 B2
(45) Date of Patent: Dec. 13, 2016

(54) DIGITAL POSITION INDICATOR

(71) Applicant: ELESA S.p.A., Milan (IT)

(72) Inventor: Alberto Bertani, Monza (IT)

(73) Assignee: ELESA S.P.A., Milan (IT)

( * ) Notice: Subject to any disclaimer, the term of this patent is extended or adjusted under 35 U.S.C. 154(b) by 0 days.

(21) Appl. No.: 14/727,421

(22) Filed: Jun. 1, 2015

(65) Prior Publication Data

US 2015/0359116 A1    Dec. 10, 2015

(30) Foreign Application Priority Data

Jun. 6, 2014  (IT) .......................... MI2014000192 U
May 5, 2015  (IT) .......................... MI2015000099 U

(51) Int. Cl.
| | | |
|---|---|---|
| *G08B 1/08* | (2006.01) | |
| *H05K 5/02* | (2006.01) | |
| *G01D 11/24* | (2006.01) | |
| *G08B 25/10* | (2006.01) | |
| *G01D 5/14* | (2006.01) | |
| *B23Q 17/22* | (2006.01) | |

(52) U.S. Cl.
CPC ............. *H05K 5/0217* (2013.01); *B23Q 17/22* (2013.01); *G01D 5/145* (2013.01); *G01D 11/24* (2013.01); *G08B 25/10* (2013.01)

(58) Field of Classification Search
CPC .................................. G08B 25/10; G05K 5/02
USPC .......... 340/539.1, 686.1, 540, 541, 435, 438
See application file for complete search history.

(56) References Cited

U.S. PATENT DOCUMENTS

| | | | |
|---|---|---|---|
| 5,012,169 A * | 4/1991 | Ono .......................... | B25J 9/126 |
| | | | 318/568.2 |
| 8,199,251 B2 * | 6/2012 | Woodman .............. | G03B 17/02 |
| | | | 348/375 |
| 2015/0211581 A1 * | 7/2015 | Murphy ................. | G01H 1/003 |
| | | | 340/682 |

* cited by examiner

*Primary Examiner* — Tai Nguyen
(74) *Attorney, Agent, or Firm* — Pearne & Gordon LLP

(57) ABSTRACT

Position indicator of the movements of bodies or elements of a tool machine, of the type comprising a numerator body (1), enclosed above and laterally in a carter (2) and below by a base (7), said body (1) providing a central bush (3) for the housing of a shaft, a position viewing screen (4), an electronic printed circuit (9) to which a magnetic ring (11) is connected, provided on said shaft and associated with a pair of reading sensors of the movement of said ring (11), a compartment (10) for the housing of a battery (6) powering said electronic printed circuit (9) and a frame (12) protecting the elements within said body (1), on the top of which an upturned-base bush (13) is kept in engagement, characterized in that there are provided means for the perfect sealing from dust and from temporary immersion in water.

12 Claims, 1 Drawing Sheet

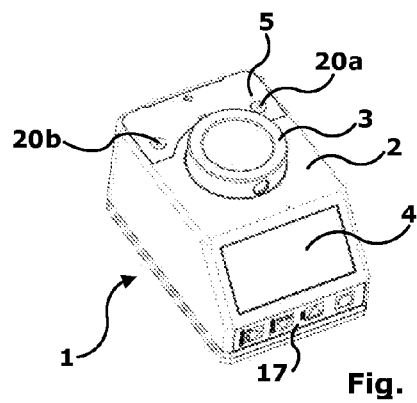
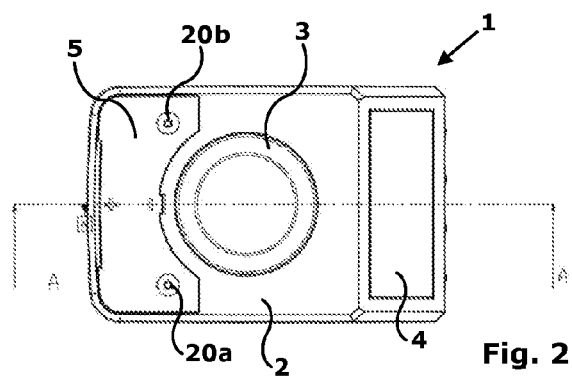
Fig. 1
Fig. 2
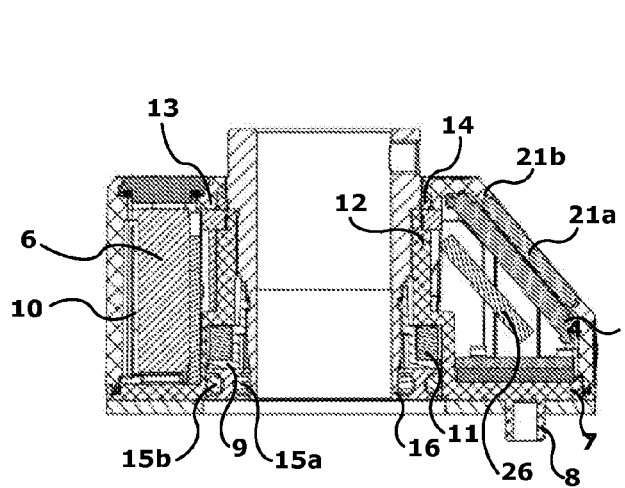
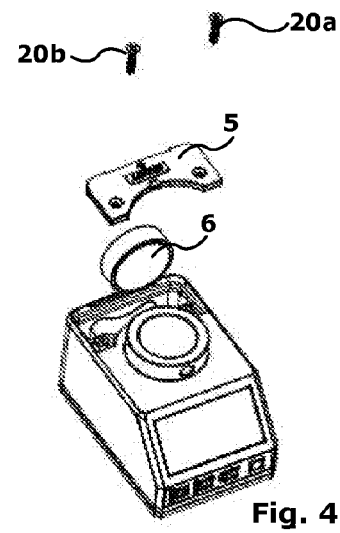
Fig. 3
Fig. 4
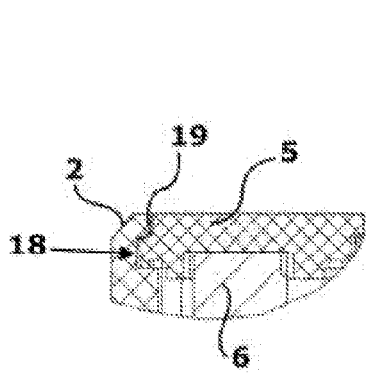
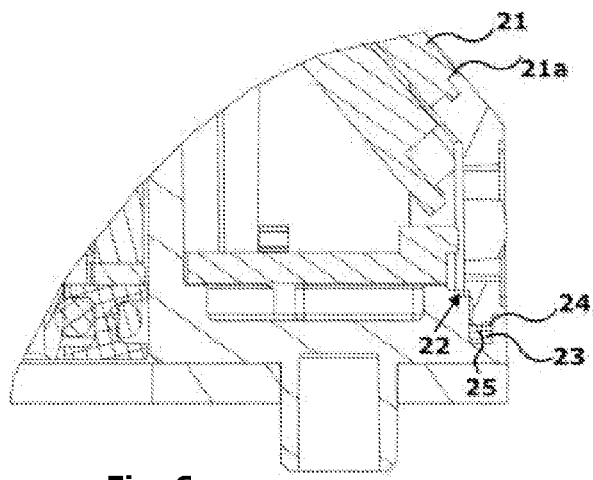
Fig. 5
Fig. 6

DIGITAL POSITION INDICATOR

The present invention relates to a position indicator, in particular to a digital position indicator provided with devices apt to guarantee both impermeability from powders and water and data transmission to a remote system.

BACKGROUND

Position indicators have been known for a long time, these are devices apt to detect the instant displacement of an element, or member, of an industrial operating machine during the adjustment thereof. This type of device is normally associated with an actuation shaft of the machine element and makes a number visible—and due to this it is called also numerator—indicating the position reached by the machine element depending on the revolution number and on the revolution fractions of said shaft. Thereby, acting on different control shafts, the operator is able to set up in the correct position, by suitably adjusting the different elements making up the machine for the process it is to carry out.

The actuation shaft of this type of device is usually engaged with a suitable bush seat, freely rotating in the position indicator support, and associated with a motion transmission so as to transmit the motion to measuring means and means for viewing the displacement that has taken place.

Typically, this type of device can be based on a mechanical or digital measurement. In the case of digital level indicators, it is necessary to provide an electric supply, and therefore to actuate the safety rules for guaranteeing protection of the operators and of the machine. For such purpose, the ruling bodies, such as the Comitato Elettrotecnico Italiano (CEI, Italian Electrotechnical Committee), have defined a classification for indicating in short the protection level of an electric apparatus from accidental or intentional contact with a human body or with objects, and the protection from water contact, reported in the jargon as IP Classification.

The manufacturers of electric and electronic machines are continuously looking for devices which are able to meet the strict properties of the highest degrees of the IP classification, therefore improving their equipment with special devices.

In particular, however, the Applicant could detect that known-art position indicators are unable to simultaneously provide full protection from dust and protection from temporary immersion, properties indicated in the classification by wording in International Protection Code 67 (IP67).

However, it is understood that these properties have a fundamental strategic importance for a special type of processing, for which it is necessary to work simultaneously with significant amounts of dust in the presence of liquid substances (think of certain types of cutting systems, in which precise measurement is a fundamental element).

BRIEF SUMMARY

The object of the present invention is therefore to accomplish a digital position indicator capable of providing full protection from dust and protection from temporary immersion.

Said object is achieved through a position indicator having the features described in claim 1.

The need to obtain in real time, and at a distance, the data relating to the relative position of one or more position indicators connected to a single control centre has furthermore been detected, so as to obtain a precise and reliable control of the work simultaneously carried out by multiple machines by a single operator.

Moreover, since a single machine has multiple functions, and multiple mounted indicators accordingly, it frequently happens that the different indicators have a different initial position. It also happens that certain indicator parameters are different, varying the instrument associated with the indicator according to the processing.

It is therefore a further object of the present invention to also have a system which can make available in real time the different operation settings, accessing a dedicated memory, possibly remote, indicators which are recalled when the type of processing is chosen, transmitting them then to the position indicators.

Said further object is obtained through a position indicator having the features reported in claim 2).

The dependent claims relate to some advantageous additional properties.

BRIEF DESCRIPTION OF THE DRAWINGS

The invention is now described with reference to the attached drawings, wherein:

FIG. 1 is a top perspective view of the position indicator according to the invention;

FIG. 2 is a top plan view of the position indicator according to the invention;

FIG. 3 is a section view taken along the line A-A of the position indicator of FIG. 2;

FIG. 4 is the view of the insertion system of the operation battery of the position indicator according to the invention.

FIG. 5 is the view of the engagement area detail between the carter and the cover in correspondence of the battery housing compartment;

FIG. 6 is the view of the detail relating to the engagement area surrounding the button panel of the position indicator according to the invention.

DETAILED DESCRIPTION

The position indicator according to the invention consists of a numerator body 1, enclosed in a carter 2, which provides a central bush 3 for the housing of a shaft, a position viewing screen 4 and a cover 5 of the housing compartment of a supply battery 6.

The body of indicator 1, and the carter 2 thereof rest on a base 7 perforated in correspondence of central bush 3 and of a pin 8 engaging with the surface on which body 1 is fixed.

Within said body 1 two front and rear chambers are found, respectively, with respect to central bush 3 for the housing of the shaft, mutually kept in connection laterally to bush 3 through an electronic printed circuit 9. In the rear chamber, in a compartment 10, battery 6 for the supply of the electronic printed circuit and of screen 4 is housed. A magnetic ring 11 is connected with said printed circuit 9, said ring 11 being provided on said rotation shaft and associated with a pair of reading sensors of the movement of ring 11 and of the transmission to the above-said printed circuit 9 of the counting of the rotations performed.

For the protection of the internal elements, and in particular the electric and electronic components, from base 7 a frame 12 projects, shaped in order to guarantee full mechanical protection of the device. In correspondence of the top thereof, it is provided—engaged therewith through suitable snap elements—an upturned-base bush 13.

In order to avoid malfunctioning in case of contact with dust or water, between said bush 13 and device-closing carter 2, surrounding bush 3, a sealing o-ring 14 is provided. The shape of carter 2 is such as to house precisely above-said o-ring 14.

Similarly, for the same objects, it has been arranged that at the opposite end, that is, in correspondence of the contact area between bush 3 and base 7, a pair of sealing o-rings 15*a*, 15*b* is inserted, kept in position by an annular, double-T support 16. The sealing-support assembly is kept laterally in position by the shape of frame 12 and above by the magnetic ring case.

Given the need to limit the risk of undesired drawings, it has furthermore been provided to increase the sealing of the areas for which a window on carter 2 is necessary. It has thus become necessary to change the morphological features of the closing cover of the battery compartment and of the front area, where windows are provided for screen 4 and for the button panel 17 for device adjustment and actuation.

Thereby, in correspondence of the opening of the battery compartment: as illustrated in FIG. 4, an undercut engagement 18 has been provided between carter 2 and cover 5; the contact area is furthermore protected by a sealing gasket 19, which is kept compressed by two screws 20*a*, 20*b*.

Moreover, in correspondence of the front surface, where screen 4 and the button panel are housed, further devices are provided. In particular, in correspondence of screen 4 an overprinted transparent lamina 21 is arranged for the protection of the underlying window and of screen 4.

As can be clearly seen in FIGS. 2 and 4, transparent lamina 21 has along the edge thereof a pair of perimeter tabs 21*a*, 21*b* for the engagement with a complementary groove provided on the window frame.

Moreover, as illustrated in FIG. 5, it is provided that the sealing connection between carter 2 and frame 12 occurs in two sites, through a welding joint in 22 and a sealing gasket 23 housed in a groove 24 of frame 12, with which a apex 25 projecting from the bottom end of said carter 2 engages. Although it was theoretically sufficient to provide the sole welding joint in 22, thereby greater safety is achieved. The welding joint, when closing, pushes the above-said apex 25 against joint 23, thereby guaranteeing full sealing, or more precisely a double sealing.

In order to guarantee communication with a remote control device, it has furthermore been provided to insert a radiofrequency receiving-transmitting module 26, powered by battery 6. Battery 6 guarantees to module 26—and to the operator—an uninterrupted lifetime of the device—and of the connection thereof to the master—from one to five years.

Finally, since the ultrasound welding of all joining elements is provided, it has become necessary to size the electronics so that they can withstand the vibrations which this kind of welding implies.

It can be well understood that the main criticality of the position indicator now described lies in the mounting and in the communication system adopted by module 26.

In order to solve the first problem, it is necessary to apply extreme precision and care in order to be certain of a stable and perfectly sealing structure.

As far as the second problem is concerned, instead, module 26 is suitably kept in radio connection with a managing element of the various radio connections, usually housed on a host device, such as an industrial PC, PLC, dedicated control device, etc.).

While the connection between the managing element of the radio connections and module 26 occurs through the conventional "master-slave" communication, for the communication between the master and the host device a serial interface RS232/RS422/RS485 is provided.

As it can be easily understood, a position indicator has been obtained which can be arranged in any location of the machine on which it is to be mounted, with no need for cables, electric lines and other connecting and joining elements.

During operation, with the position indicator on, slave module 26 transmits the information of specific interest, that is, the measurements measured instant by instant, the operation mode and the diagnostic information, to the master. The data are collected in dedicated registers and are available to the operator on the host element at any time.

The shaft with which the individual position indicator is associated is thus manually arranged in the correct location by the operator, and only when all the shafts are in order does the operator start the processing. Thereby, it can be assured that the machine does not start with one or more shafts in an incorrect position: thereby the certainty of fewer wastes and greater safety is obtained.

The host element can also write the data again to the slave elements through the master device: typically a target position measurement, or a specific deviation, is transmitted, but it could also be any defined piece of information of the application.

Due to the nature of the device, and to the standard operation thereof, the number of slave position indicators which connect to a single master device may vary from 1 to 256 simultaneously operating ones.

In order to allow correct communication, the network of position indicators which directs the data to a single machine works on the specific frequency channel, which can be programmed on the master and slave elements. Usually, the channel is associated with the series number of the machine, so as to be certain that the network does not interfere with the networks of the machines arranged nearby.

Usually, communication uses industrial, scientific and medical (ISM) frequency intervals which are free for short range devices (SRD).

The information exchange between Slave and Master is exclusively digital and safe. Thereby the operator is sure that there can be no transmission of fake data. Any possible interference which has originated from an external source or from electric lines undergoes a filter and is excluded.

The set objects have therefore been achieved: firstly, a compact, solid device capable of guaranteeing perfect sealing from dust and from temporary immersion in water has been obtained, due to the careful isolation of the areas risking drawing of liquids and dusts and to the careful arrangement of components capable of withstanding the strict building problems. In particular, a special position indicator has been obtained which is capable of meeting all the properties for which it is classifiable as IP67.

Secondly, a position indicator has been obtained which is capable of transmitting and receiving information in a telecommunication network, and in particular in a connection with a master device associated with a host device.

It can easily be understood that the description has been made with reference to a specific variant, and to a special use, of the device according to the invention.

However, it is understood that the protection of the above-described invention must not be considered limited to the particular illustrated variant, but extends to any other technically equivalent construction variant.

The invention claimed is:

1. A position indicator for obtaining in real time data relating to a relative position of members or elements of a tool machine and indicating the position reached by the members or elements of the tool machine depending on a revolution number and on a revolution fractions of said members or elements of the tool machine, said indicator comprising a numerator body (1), enclosed above and laterally in a carter (2) and below by a base (7), said body (1) providing a central bush (3) configured to house a shaft, a screen (4) for viewing a position, an electronic printed circuit (9) to which a magnetic ring (11) is connected provided on said shaft and associated with a pair of reading sensors for reading movement of said ring (11) correlating to said shaft and transmission to the electronic printed circuit for counting said revolution number and the revolution fractions of said shaft, a compartment (10) configured to house a battery (6) powering said electronic printed circuit (9) and a protection frame (12) of elements within said body (1), on top of said protection frame an upturned-base bush (13) being kept in engagement, wherein
means for perfect sealing from dust and from temporary immersion in water are provided, said sealing means from water and dust in correspondence of an upper exit of said bush (3) consisting of a sealing o-ring (14) between said base bush (13) and said carter (2).

2. Position indicator as in claim 1 wherein means (26) are furthermore provided for radiofrequency communication with a remote control device.

3. Position indicator as in claim 2 wherein means (26) for radiofrequency communication consist of a receiving-transmitting module (26) powered by said battery (6).

4. Position indicator as in claim 3 wherein said remote control device is housed on a host device and is apt to simultaneously manage up to 256 receiving-transmission modules (26).

5. Position indicator as in claim 3 wherein the communication between said module (26) and said remote control device occurs on industrial, scientific and medical (ISM) frequency intervals free for short range devices (SRI).

6. Position indicator as in claim 5 wherein communication between said module (26) and said remote control device is exclusively digital.

7. Indicator as in claim 6 wherein a filter is provided apt to exclude interference data coming from external sources.

8. Position indicator as in claim 1 wherein said sealing means from dust and water in correspondence of a lower exit of said bush (3) consist of a pair of o-ring gaskets (15a, 15b) kept in position by an annular, double-T support (16) which rests on said base 7.

9. Position indicator as in claim 1 wherein said sealing means from water and dust in correspondence of a window on said carter (2) for access to said compartment (10) for said battery (6) provide an undercut engagement (18) between said carter (2) and a cover (5) of said compartment (10) and a sealing gasket, which is kept compressed by a pair of screws (19a, 19b).

10. Position indicator as in claim 1 wherein said sealing means from water and dust in correspondence of the window on said carter (2) for access to said screen (4) and to a button panel (17) for device adjustment and actuation consist of an overprinted, transparent lamina (21) for protection of a window and of the screen (4) underlying said window, said transparent lamina (21) having along an edge thereof a pair of perimeter tabs (21a, 21b) for the engagement with a complementary groove provided on the frame of said windows of said carter (2).

11. Position indicator as in claim 1 wherein said sealing means from water and dust in correspondence of the window for access to a button panel (17) consist of a welding joint in (22) and of a sealing gasket (23) arranged in a groove (24) of said frame (12), said gasket (23) being kept in a stable position through the engagement of an apex (25) projecting from the bottom end of said carter (2).

12. Position indicator as in claim 1 wherein it is classified as International Protection Code 67 (IP67) in the International Protection (IP) Classification.

* * * * *

UNITED STATES PATENT AND TRADEMARK OFFICE
CERTIFICATE OF CORRECTION

PATENT NO. : 9,521,768 B2
APPLICATION NO. : 14/727421
DATED : December 13, 2016
INVENTOR(S) : Alberto Bertani It is certified that error appears in the above-identified patent and that said Letters Patent is hereby corrected as shown below:

In the Claims

Column 5, Line 40, "frequency intervals free for short range devices (SRI)" should read -- frequency intervals free for short range devices (SRD) --.

Signed and Sealed this
Twenty-first Day of March, 2017

Michelle K. Lee
*Director of the United States Patent and Trademark Office*